(12) United States Patent
Miyashita (10) Patent No.: US 7,567,421 B2
(45) Date of Patent: Jul. 28, 2009

(54) BIPOLAR ELECTROSTATIC CHUCK

(75) Inventor: Kinya Miyashita, Kawasaki (JP)

(73) Assignee: Creative Technology Corporation, Kawasaki-shi (JP)

( * ) Notice: Subject to any disclaimer, the term of this patent is extended or adjusted under 35 U.S.C. 154(b) by 401 days.

(21) Appl. No.: 10/561,159

(22) PCT Filed: Jun. 15, 2004

(86) PCT No.: PCT/JP2004/008679

§ 371 (c)(1),
(2), (4) Date: Dec. 16, 2005

(87) PCT Pub. No.: WO2004/112123

PCT Pub. Date: Dec. 23, 2004

(65) Prior Publication Data

US 2006/0158821 A1    Jul. 20, 2006

(30) Foreign Application Priority Data

Jun. 17, 2003  (JP)  ............................. 2003-172470

(51) Int. Cl.
*H01L 21/683* (2006.01)
*B23Q 3/15* (2006.01)
(52) U.S. Cl. ...................... 361/234; 118/500; 118/730; 156/345.23
(58) Field of Classification Search ................. 279/128; 361/234, 233; 118/500, 730; 156/345.23
See application file for complete search history.

(56) References Cited

U.S. PATENT DOCUMENTS

| | | | |
|---|---|---|---|
| 4,384,918 A * | 5/1983 | Abe | 216/71 |
| 5,055,964 A * | 10/1991 | Logan et al. | 361/234 |
| 5,099,571 A * | 3/1992 | Logan et al. | 29/825 |
| 5,103,367 A * | 4/1992 | Horwitz et al. | 361/234 |
| 5,213,349 A * | 5/1993 | Elliott | 279/128 |
| 5,535,507 A * | 7/1996 | Barnes et al. | 29/825 |
| 5,561,585 A * | 10/1996 | Barnes et al. | 361/234 |
| 5,572,398 A * | 11/1996 | Federlin et al. | 361/234 |
| 5,612,851 A * | 3/1997 | Barnes et al. | 361/234 |
| 5,822,171 A * | 10/1998 | Shamouilian et al. | 361/234 |
| 5,835,333 A * | 11/1998 | Castro et al. | 361/234 |
| 5,835,335 A * | 11/1998 | Ross et al. | 361/234 |
| 5,838,528 A * | 11/1998 | Os et al. | 361/234 |
| 5,870,271 A * | 2/1999 | Herchen | 361/234 |
| 5,880,923 A * | 3/1999 | Hausmann | 361/234 |

(Continued)

FOREIGN PATENT DOCUMENTS

JP  05190655 A * 7/1993

(Continued)

*Primary Examiner*—David P Bryant
*Assistant Examiner*—Eric A Gates
(74) *Attorney, Agent, or Firm*—Birch, Stewart, Kolasch & Birch, LLP (57) ABSTRACT

A bipolar electrostatic including a chuck main body having a mounting surface; an annular electrode member formed in an annular configuration wit a center opening and fixed onto the mounting surface of the chuck main body though an adhesive layer; an inner electrode member disposed at a given clearance from the annular electrode member within the center opening of the annular electrode member and fixed onto the mounting surface through the adhesive layer; and an outer electrode member disposed at a given clearance from the annular electrode member outside of the annular electrode member and fixed onto the mounting surface through the adhesive layer.

9 Claims, 3 Drawing Sheets

U.S. PATENT DOCUMENTS

| | | | |
|---|---|---|---|
| 5,886,866 A * | 3/1999 | Hausmann | 361/234 |
| 5,946,184 A * | 8/1999 | Kanno et al. | 361/234 |
| 6,023,405 A * | 2/2000 | Shamouilian et al. | 361/234 |
| 6,028,762 A * | 2/2000 | Kamitani | 361/234 |
| 6,088,213 A * | 7/2000 | Herchen | 361/234 |
| 6,115,232 A * | 9/2000 | Hass et al. | 361/234 |
| 6,215,643 B1 * | 4/2001 | Nagasaki | 361/234 |
| 6,243,251 B1 * | 6/2001 | Kanno et al. | 361/234 |
| RE37,541 E * | 2/2002 | Barnes et al. | 361/234 |
| RE37,580 E * | 3/2002 | Barnes et al. | 361/234 |
| 6,373,681 B2 * | 4/2002 | Kanno et al. | 361/234 |
| 6,583,979 B1 * | 6/2003 | Takahasi et al. | 361/234 |
| 2002/0159216 A1 * | 10/2002 | Ennis | 361/234 |
| 2003/0165044 A1 * | 9/2003 | Yamamoto | 361/234 |
| 2004/0252439 A1 * | 12/2004 | Ennis | 361/234 |
| 2008/0089001 A1 * | 4/2008 | Parkhe et al. | 361/234 |

FOREIGN PATENT DOCUMENTS

| | | |
|---|---|---|
| JP | 5-283513 A | 10/1993 |
| JP | 07-201959 A | 8/1995 |
| JP | 07-201960 A | 8/1995 |
| JP | 7-201961 A | 8/1995 |
| JP | 07-201962 A | 8/1995 |
| JP | 8-330405 A | 12/1996 |
| JP | 10-144778 A | 5/1998 |
| JP | 10-270539 A | 10/1998 |
| JP | 11-87481 A | 3/1999 |
| JP | 2000-183143 A | 6/2000 |
| JP | 2003-60020 A | 2/2003 |

* cited by examiner

BIPOLAR ELECTROSTATIC CHUCK

TECHNICAL FIELD

The present invention relates to a bipolar electrostatic chuck used in a semiconductor manufacturing device or a liquid crystal manufacturing device, and more particularly to a bipolar electrostatic chuck that not only can absorb a sample such as a liquid crystal glass substrate, but also can readily separate a chuck main body that constitute an electrostatic chuck from respective electrode members after being used by the semiconductor manufacturing device for recycle.

BACKGROUND ART

For example, in a semiconductor manufacturing process, drying of the process has been rapidly advanced in recent years, and there has been employed a semiconductor manufacturing device such as a plasma etching device, a plasma CVD device, an ion implanting device, an ashing device, an electron beam lithography device, or an X-ray lithography device. In those devices, a sample such as semiconductor wafer has been frequently processed in a vacuum.

Also, as means for holding the sample in those devices, there have been proposed methods such as a mechanical chuck using a mechanical method, a vacuum chuck using a differential pressure from the atmospheric pressure, and an electrostatic chuck using an electrostatic adsorption force. Of those methods, the electrostatic chuck is advantageous in that the sample and a holder are held thermally uniformly and with high reliability.

Then, as one type of those electrostatic chucks, there has been employed a bipolar electrostatic chuck. The bipolar electrostatic chuck is made up of, for example, a first electrode that is a large part and forms a base, and a second electrode that is disposed on the first electrode and is of an annular configuration with a center opening. When a dc power supply is connected between the first electrode and the second electrode, and a sample such as a semiconductor wafer is mounted on a sample adsorption surface formed an upper surface of the first electrode and an upper surface consisting of the second electrode, the sample is absorbed and held by an electrostatic attractive force developed between a lower surface of the sample and the sampling adsorption surface.

In the above bipolar electrostatic chuck, the first electrode that forms the base generally has an electrode recess formed by subjecting its upper surface to mechanical processing, and the second electrode having the annular configuration is held within the electrode recess (for example, refer to JP 2610112 B, JP 2610113 B, JP 2614421 B, and JP 2614422 B). In the thus formed bipolar electrostatic chuck, a slight clearance is formed between the second electrode in which the electrode recess is disposed and the first electrode. Therefore, it is important to form the clearance with high precision for holding reliably the sample like a wafer with electrostatic adsorption force. In the bipolar electrostatic chuck, a corner of the electrode recess formed on the first electrode is rounded with a given radius curvature to a recess bottom surface (for example, refer to JP 2610112 B, and JP 2610113 B).

Also, as another example of the bipolar electrostatic chuck, a dc power supply is connected between an electrode member that is disposed in a recess groove defined in the vicinity of the center of a main member that forms the base and an outer electrode member that is disposed in a recess groove defined at an outer side of the vicinity of the center of the main member (for example, refer to U.S. Pat. No. 5,213,349).

However, in the bipolar electrostatic chuck of the type that forms the electrode recess in the upper surface of the first electrode and holds the second electrode in the electrode recess as described above, complicated mechanical processing that needs a high processing precision is required for forming a slight clearance between the electrodes and rounding the corner of the electrode recess. Likewise, in the electrostatic chuck of the type that form the recess groove in the vicinity of the center of the main member that forms the base and the recess groove at the outer side thereof, respectively, and connect the dc power supply to the two electrode members disposed in those recess grooves to form the bipolar type, the complicated high-precision mechanical processing is required in forming the above recess grooves and assembling the main member and the electrode member.

On the other hand, in the electrostatic chuck, an oxide coating is often formed on the surface of the electrostatic chuck for the purposes of protecting the electrostatic chuck from plasma exposure in the case where the electrostatic chuck is used in the plasma etching device, or functioning the oxide coating as a dielectric film. However, the oxide coating is corroded or reduced by an electrochemical action of ions, electrons and radicals contained in the plasma due to a long-time use in the plasma etching device. Also, in the operation of fitting or removing the electrostatic chuck in the semiconductor manufacturing device, the oxide coating such as the sample adsorption surface may be scratched by a tool in error. The above deterioration or scratch of the oxide coating of the electrostatic chuck causes the electrical isolation to be deteriorated to increase a leakage current between the bipolar, or causes the adsorptive force with respect to the sample such as the wafer to be deteriorated. For that reason, in the electrostatic chuck that has been deteriorated by use as described above, even if portions except for the oxide coating on the surface thereof are perfectly sound, the electrostatic chuck is scrapped as it is, or it is necessary to reproduce the oxide coating lost due to the deterioration or scratch if the electrostatic chuck is recycled without being scrapped.

In order to recycle the bipolar electrostatic chuck that has been used as described above, it is necessary to disassemble the bipolar electrostatic chuck once. In other words, in the bipolar electrostatic chuck of the type that has the second electrode disposed in the electrode recess of the first electrode, it is necessary to separate the second electrode from the electrode recess of the first electrode. Similarly, in the bipolar electrostatic chuck of the type that has the inner electrode member and the outer electrode member disposed in the recess groove formed in the vicinity of the center of the main member and the recess groove formed at the outer side, respectively, it is necessary to separate the respective electrode members from the main member. In the respective electrodes, the respective electrode members, and the main member, there has been required a recycle process in which an oxide coating is again formed after the oxide coating formed on the respective surfaces of those members is stripped once and the surfaces are then polished.

However, in the electrostatic chucks of any types, in order to remove the annular electrodes disposed in the recess of the electrode or the recess groove, a heat treatment must be conducted to break down an adhesive layer that fixes the annular electrode within the recess or the recess groove, or the annular electrode must be removed by mechanical means. Thus, there are many cases in which it is difficult to disassemble the bipolar electrostatic chuck that has been assembled once. Also, the configurations of the surfaces of the separated first electrode and main member onto which the second electrode and the electrode member had been fixed are complicated. As a result, a polishing process or an oxide coating reproducing process necessary for recycle is complex and diverse, and a large number of processing steps are required in order to use the electrostatic chuck again, thereby increasing the reproduction costs. Also, the reproduced oxide coating may lack the coating intensity on the boundary surface of the reproduced electrode, thereby leading to such a problem that the durability is deteriorated. In addition, even if various reproducing processes are conducted, the electrode that has been subjected to the respective processing required for reproduction increase the amount of reduced dimensions as compared with the electrodes that have not yet been reproduced. As a result, there arises such a problem that the electrode cannot be again used in the semiconductor manufacturing device even if the electrode is assembled as the electrostatic chuck again. For that reason, even if the electrostatic chuck is recycled, the number of times of reproductions is extremely restricted, and there are many cases in which it is substantially difficult to recycle the used electrostatic chuck.

DISCLOSURE OF THE INVENTION

Under the above circumstances, as a result of earnestly studying a bipolar electrostatic chuck that can be manufactured easily as compared with the conventional bipolar electrostatic chuck, can be readily separated and assembled after having been used, and can be efficiently recycled, the inventors of the present invention have completed the invention that solves the above problem by forming a sample adsorption surface that absorbs a sample by respective electrode members mounted onto a mounting surface of a chuck main body through an adhesive layer, and enabling the respective electrode members to be readily separated from the mounting surface after use.

Accordingly, an object of the present invention is to provide a bipolar electrostatic chuck that is easier in manufacture than the conventional bipolar electrostatic chuck, can readily separate the chuck main body and the electrode member which constitute the electrostatic chuck from each other, and can effectively realize the recycle.

Also, the present invention provides a bipolar electrostatic chuck, comprising: a chuck main body having a mounting surface; an annular electrode member which is formed in an annular configuration with a center opening and is fixed onto the mounting surface of the chuck main body through an adhesive layer; an inner electrode member which is disposed at a given clearance from the annular electrode member within the center opening of the annular electrode member and is fixed onto the mounting surface through the adhesive layer; and an outer electrode member which is disposed at a given clearance from the annular electrode member outside of the annular electrode member and is fixed onto the mounting surface through the adhesive layer, wherein the chuck main body, the inner electrode member, and the outer electrode member constitute a first electrode, and the annular electrode member constitutes a second electrode.

In the present invention, the chuck main body may include a mounting surface onto which an annular electrode member, an inner electrode member, and an outer electrode member can be mounted, and the configuration of the mounting surface can be identical with the configuration of a general bipolar electrostatic chuck. For example, a flange may be disposed on an outer peripheral surface of the chuck main body so that the electrostatic chuck can be detachably mounted onto a semiconductor manufacturing device.

Also, in the present invention, an annular electrode member that is fixed onto the mounting surface of the chuck main body through an adhesive layer may be formed in an annular shape having a center opening, and the configuration of the annular electrode member can be formed in correspondence with the size or the configuration of a sample to be absorbed. In other words, because the annular electrode member constitutes the second electrode in the bipolar electrostatic chuck according to the present invention, the configuration and the area of the annular electrode member can be designed in such a manner that the electrostatic adsorptive force to the sample can be exhibited optimally. For example, in the case where the sample to be absorbed is a circular sample such as the semiconductor wafer, it is preferable that the configuration of the annular electrode member is a toric electrode member in which both of the outer peripheral configuration and the center opening configuration are circular. For example, in the case of the electrostatic chuck that holds a liquid crystal glass substrate that is generally rectangular or square, it is preferable that the annular electrode member is formed of a square annular electrode member in which both of the outer peripheral configuration and the center opening configuration are square.

Also, in the present invention, the inner electrode member that is fixed onto the mounting surface of the chuck main body through the adhesive layer is disposed at a given clearance from the annular electrode member within the center opening of the annular electrode member. The inner electrode member can be formed in correspondence with the size and the configuration of the sample to be absorbed. In other words, the inner electrode member constitutes the first electrode together with the outer electrode member or together with the outer electrode member and the chuck main body in the bipolar electrostatic chuck according to the present invention. As a result, the inner electrode member can be designed to the configuration and the area which can optimally exhibit the electrostatic adsorptive force to the sample. For example, when the sample to be absorbed is formed of a circular sample such as a semiconductor wafer, it is preferred to use a circular inner electrode member having an outer diameter slightly smaller than the center opening diameter in correspondence with the configuration of the center opening of the annular electrode member. For example, when the sample is a rectangular sample such as a liquid crystal glass substrate, it is preferred to use a rectangular inner electrode member slightly smaller than the opening configuration of the center opening in correspondence with the configuration of the center opening of the annular electrode member.

Also, in the present invention, the outer electrode member that is fixed onto the mounting surface of the chuck main body through the adhesive layer is disposed at a given clearance from the annular electrode member outside the annular electrode member. The outer electrode member can be formed in correspondence with the size and the configuration of the sample to be absorbed. In other words, the outer electrode member constitutes the first electrode together with the inner electrode member or together with the inner electrode member and the chuck main body in the bipolar electrostatic chuck according to the present invention. As a result, the outer electrode member can be designed to the configuration and the area which can optimally exhibit the electrostatic adsorption force to the sample. For example, when the sample to be absorbed is formed of a circular sample such as a semiconductor wafer, it is preferable to use the circular outer electrode member having the center opening slightly larger than the outer diameter of the circular electrode member in correspondence with the configuration of the outer circumference of the annular electrode member. For example, when the sample is a rectangular sample such as a liquid crystal glass substrate, it is preferred to use the square circular outer electrode member having the center opening slightly larger than the outer diameter of the circular electrode member in correspondence with the configuration of the outer circumference of the annular electrode member.

An oxide coating is formed on the respective surfaces of the annular electrode member, the inner electrode member, and the outer electrode member. The oxide coating is formed on at least the mounting surface and the outer peripheral surface of the chuck main body in the chuck main body. Then, when the annular electrode member, the inner electrode member, and the outer electrode member are fixed onto the mounting surface of the chuck main body through the adhesive layer, a sample adsorption surface that absorbs the sample such as a semiconductor wafer is formed on the upper surfaces (a surface opposite to the mounting surface side of the chuck main body) of the annular electrode member, the inner electrode member, and the outer electrode member. In this situation, a given clearance defined between the annular electrode member and the inner electrode member, and a given clearance defined between the annular electrode member and the outer electrode member can be appropriately designed so as to exhibit the optimum electrostatic adsorptive force to the sample. Also, a gap in the predetermined clearance defined between the respective electrode members may be formed with a space as it is, or a part of the adhesive layer which remains when the respective electrode members are fixed onto the mounting surface may be inserted into the gap.

Also, it is preferable that an outer convex portion for positioning the outer electrode member with respect to the mounting surface in the heightwise direction, and/or an inner convex portion for positioning the inner electrode member with respect to the mounting surface in the heightwise direction are disposed on the mounting surface of the chuck main body according to the present invention. It is more preferable that both of the outer convex portion and the inner convex portion are disposed. The outer convex portion is disposed at a position corresponding to a bottom surface (a surface opposite to a surface that forms a sample adsorption surface) of the outer electrode member that is fixed onto the mounting surface of the chuck main body through the adhesive layer, and is a mounting reference with respect to the mounting surface in the heightwise direction when the outer electrode member is fixed onto the mounting surface. Also, the inner convex portion is disposed at a position corresponding to a bottom surface (a surface opposite to the surface that forms the sample adsorption surface) of the inner electrode member that is fixed onto the mounting surface of the chuck main body through the adhesive layer, and is a mounting reference with respect to the mounting surface in the heightwise direction when the inner electrode member is fixed onto the mounting surface. The configurations of the outer convex portion and the inner convex portion are not particularly restricted, and for example, a protruding recess portion may be provided on the mounting portion, or a ridge convex portion may be disposed in the form of a ridge.

In the case where the mounting surface of the chuck main body according to the present invention has the outer convex portion and/or the inner convex portion, the adhesive layer is disposed in a space that is sectioned by the outer convex portion and/or the inner convex portion in the mounting surface. Then, even if the outer electrode member that is fixed through the adhesive layer is configured to be planar and easily warped, the outer convex portion becomes a mounting reference in fixing the outer convex portion is dispose on the mounting surface while the outer convex portion is disposed on the mounting surface. As a result, the outer convex portion can be mounted flatly on the mounting surface. Likewise, even if the inner electrode member is configured to be planar and easily warped, the inner convex portion becomes a mounting reference in fixing the inner convex portion is disposed on the mounting surface while the inner convex portion is disposed on the mounting surface. As a result, the inner convex portion can be mounted flatly on the mounting surface.

Also, the outer convex portion may be formed by a ridge convex portion that is disposed at a position corresponding to the peripheral edge which is an outer periphery of the outer electrode member on the mounting surface. With this structure, in the case where the outer electrode member is mounted onto the mounting surface of the chuck main body, the adhesive layer is not exposed between the chuck main body and the outer electrode member. As a result, in the case where the electrostatic chuck is used in the plasma etching device, the adhesive layer is not directly exposed to the plasma. Also, the inner convex portion is processed together with the ridge convex portion disposed at a position corresponding to the outer electrode member as the ridge convex portion that is disposed at a position corresponding to the peripheral edge which is the outer periphery of the inner electrode member on the mounting surface. As a result, the height of the ridge convex portion corresponding to the outer electrode member and the height of the ridge convex portion corresponding to the inner electrode member can be trued up with a high precision. Then, the height positions of the upper surfaces of the outer electrode member and the inner electrode member whose mounting references are the outer convex portion and the inner convex portion coincide with each other with a high precision.

Also, in the present invention, it is preferable that positioning pins that position the inner electrode member, the annular electrode member, and the outer electrode member with respect to the mounting surface in the horizontal direction are disposed between the chuck main body, and the inner electrode member, the annular electrode member, and the outer electrode member which are fixed on the chuck main body through the adhesive layer, respectively. The configurations of the positioning pins are not restricted if the respective electrode members are positioned horizontally with respect to the mounting surface of the chuck main body. For example, it is possible that one end of the positioning pin is engaged with the mounting surface of the chuck main body, and the other end of the pin is engaged with the electrode member.

It is preferable that two or more positioning pins disposed between the chuck main body and the annular electrode member may be arranged on the same circumference at equal angles on the mounting surface. It is preferable that two or more positioning pins disposed between the chuck main body and the inner electrode member may be arranged on the same circumference at equal angles on the mounting surface. It is preferable that two or more positioning pins disposed between the chuck main body and the outer electrode member may be arranged on the same circumference at equal angles on the mounting surface. The provision of the pins as described above is advantageous in that the inner electrode member, the annular electrode member, and the outer electrode member which are fixed onto the mounting surface of the chuck main body can be readily positioned in the horizontal direction, respectively.

Then, in the bipolar electrostatic chuck according to the present invention, when the first electrode is formed of the chuck main body, the inner electrode member, and the outer electrode member, it is preferable that at least one of the positioning pins that are disposed between the chuck main body and the inner electrode member also serves as a conducting pin that renders the chuck main body and the inner electrode member electrically conductive to each other. Likewise, it is preferable that at least one of the positioning pins that are disposed between the chuck main body and the outer electrode member also serves as a conducting pin that renders the chuck main body and the outer electrode member electrically conductive to each other. As described above, at least one of the positioning pins that are disposed between the chuck main body and the inner electrode member, and at least one of the positioning pins that are disposed between the chuck main body and the outer electrode member also serve as the conducting pins, thereby making it possible to constitute the first electrode which is formed of the chuck main body, the inner electrode member, and the outer electrode member.

All of the positioning pins that are disposed between the annular electrode member that constitutes the second electrode and the chuck main body need to be made of a material that can keep the annular electrode member and the chuck main body in an electrically insulating state.

On the other hand, in the bipolar electrostatic chuck according to the present invention, when the first electrode is constituted by the inner electrode member and the outer electrode member, the respective positioning pins which are disposed between the chuck main body and the inner electrode member, between the chuck main body and the annular electrode member, and between the chuck main body and the outer electrode member need to be made of a material that can keep those respective electrode members in an electrically insulating state with respect to the chuck main body.

Also, in the electrostatic chuck according to the present invention, at least one of the inner electrode member, the annular electrode member, and the outer electrode member which are fixed on the mounting surface of the chuck main body through the adhesive layer may be fixed in a complementary configuration with respect to the mounting surface of the chuck main body. It is preferable that all of the inner electrode member, the annular electrode member, and the outer electrode member are fixed in a complementary configuration with respect to the mounting surface of the chuck main body. For example, the annular electrode member will be exemplified. A part of a longitudinal cross-section of the annular electrode member is so configured as to have a projection formed by intersecting two faces with each other at the bottom portion (a portion opposite to the sample adsorption surface) of the annular electrode member. Also, the mounting surface of the chuck main body onto which the annular electrode member is fixed may be formed with a tapered groove corresponding to the configuration of the bottom portion of the annular electrode member. As described above, the bottom surface of the annular electrode member that is fixed on the mounting surface of the chuck main body through the adhesive layer is mounted on the mounting surface of the chuck main body in the complementary configuration. As a result, the annular electrode member that is annularly formed can be positioned in the horizontal direction of the annular electrode member with respect to the mounting surface instead of using the above-mentioned positioning pins. The same is applied to the inner electrode member and the outer electrode member, and the inner electrode member and the outer electrode member can be positioned in the horizontal direction of the respective electrode members with respective to the mounting surface by having the complementary configuration in association with the corresponding mounting surface.

In the present invention, a positioning spacer for positing the annular electrode member with respect to the mounting surface in the heightwise direction may be interposed between the chuck main body and the annular electrode member. It is necessary that the positioning spacer is made of an electrically insulating material so that the annular electrode member and the chuck main body can be kept in the electrically insulating state. Also, it is necessary that the upper surface of the annular electrode member that is fixed onto the mounting surface through the positioning spacer is flush with the upper surfaces of the inner electrode member and the outer electrode member which are fixed on the mounting surface through the adhesive layer.

In the present invention, it is preferable that the adhesive layer that fixes the respective electrode members of the inner electrode member, the annular electrode member, and the outer electrode member onto the mounting surface of the chuck main body is formed of an adhesive layer made of one or two kinds selected from silicone adhesive agent and a polyvinyl butyral adhesive agent. It is more preferable that the adhesive layer is formed of an adhesive layer made of silicone-based adhesive agent.

For example, when the adhesive layer is made of an epoxy adhesive agent, in the case where the respective electrode members are fixed onto the mounting surface of the chuck main boy to constitute the electrostatic chuck according to the present invention, it is necessary that the adhesive layer portion is heated to carbonize the epoxy adhesive agent that is the adhesive layer in order to disassemble the electrostatic chuck and separate the respective electrode members from the chuck main body. However, the heating leads to such a fear that a material which constitutes the electrostatic chuck (for example, aluminum material) is annealed to deteriorate the mechanical strength as a material. To avoid the disassembly due to heating, it is necessary to disassemble the electrostatic chuck that has been assembled by mechanical means once.

On the contrary, when the silicone-based adhesive agent is used as the adhesive layer to constitute the electrostatic chuck of the present invention, a release agent made of toluene or xylene is used to make it possible to readily separate the respective electrode members that have been fixed onto the mounting surface not depending on the heat treatment or the mechanical means. Then, the electrostatic chuck can be separated without deteriorating the mechanical strength of the material that makes up the electrostatic chuck after separation and without scratching the electrostatic chuck because the mechanical processing is not required.

In the present invention, the silicone-based adhesive agent is preferably a gel adhesive agent or an elastomer adhesive agent, and more preferably the elastomer adhesive agent from the viewpoint of the excellent plasma resistance. The distinction of the gel adhesive agent and the elastomer adhesive agent can be conducted, for example, in such a manner that the viscosity before hardening (25° C., Pa·s) is 3 to 14 in the gel (semifluid) and 15 to 350 in the elastomer. In the hardness after hardening, the gel adhesive agent having the hardness of 20 to 80 (mm/10) in penetrometer (JIS K 2207) and the elastomer adhesive agent having the hardness of 50 to 120 in JIS type A can be preferably used. In addition, the silicone-based adhesive agent is preferably of the type containing heat transmission filler. Because the type containing the heat transmission filler therein is suitable to the electrostatic chuck of the present invention which is so structured as to mount the respective electrode members on to the mounting surface of the chuck main body because of a high thermal conductivity. In general, the normal thermal conductivity is about 0.1 to 0.5 (W/m·K), and the higher thermal conductivity is about 0.8 to 4 (W/m·K). In the present invention, the adhesive agent having the thermal conductivity of 0.1 (W/m·K) or more can be preferably used in the present invention.

On the other hand, when the polyvinyl butyral adhesive agent is used as an adhesive layer to structure the electrostatic chuck of the present invention, it is possible to readily separate the respective electrode members that have been fixed onto the mounting surface by heating at a relatively low temperature of about 150° C. As a result, there is no fear that the mechanical strength of the material that makes up the electrostatic chuck is deteriorated.

Also, in the present invention, it is preferable that any one or more of the inner electrode member, the annular electrode member, and the outer electrode member, preferably three electrode members of the inner electrode member, the annular electrode member, and the outer electrode member are made of pure aluminum. Specific examples of pure aluminum are JIS A1050, JIS A1060, JIS A1070, JIS A1080, and JIS A1100, and preferably JIS A 1100. An oxide coating is formed on the surfaces of the respective electrode members by anodic oxidation treatment that is generally conducted. In the case where the respective electrode members are made of pure aluminum, an oxide coating that is high in the electric insulating performance and high in the density can be provided as compared with an oxide coating that is formed on the surface of aluminum alloy when the base material of the oxide coating formed on the surfaces of the respective electrode members is aluminum alloy such as JIS A6061 or JIS A5052. As a result, the oxide coating that is excellent in the plasma resistance can be provided. In the case of using JIS A1100, because Si content that is the alloy component is low, the pin holes in the oxide coating that is formed on the surface can be reduced, thereby forming a further excellent oxide coating in addition to the characteristic obtained by using pure aluminum.

When the electrostatic chuck of the present invention is constituted by using the inner electrode member, the annular electrode member, and the outer electrode member which are made of pure aluminum as described above, in the case where the electrostatic chuck is used in the semiconductor manufacturing device, the performance excellent in the plasma resistance is exhibited, and the electric insulating performance of the oxide coating is stabilized for a long period of time. As a result, the product lifetime as the electrostatic chuck is elongated.

Also, since the chuck main body of the present invention requires the mechanical strength, the chuck main body is preferably made of a structural extended material. The structural extended material may be exemplified by JIS A6061, JIS A5056, and JIS A5052. The chuck main body made of the above material has the oxide coating formed on at least the respective surfaces of the mounting surface onto which the respective electrode members are fixed, and the outer peripheral surface through the anodic oxidation treatment that is generally conducted.

In the bipolar electrostatic chuck according to the present invention, when the first electrode is formed of the inner electrode member and the outer electrode member, and the second electrode is formed of the annular electrode member, the inner electrode member and the outer electrode member are made equal in potential to each other. Then, a dc power supply is connected between the first electrode formed of the inner electrode member and the outer electrode member, and the annular electrode member of the second electrode to structure the bipolar electrostatic chuck.

In the case where the first electrode is formed of the chuck main body, the inner electrode member, and the outer electrode member, it is necessary that the inner electrode member and the outer electrode member are electrically conductive to the chuck main body, respectively. For that reason, as described above, at least one of the respective positioning pins disposed between the inner electrode member and the chuck main body and between the outer electrode member and the chuck main body may also function as a conducting pin, respectively. Alternatively, another conducting pin may be disposed between the chuck main body and the inner electrode member and between the chuck main body and the outer electrode member, respectively, apart from the positioning pins. Also, the inner electrode member that is fixed on the mounting surface of the chuck main body through the adhesive layer is provided with a partial portion that comes in direct contact with the chuck main body. Then, the oxide coatings on the chuck main body and the inner electrode member at that contact portion may be removed, respectively, thereby rendering the chuck main body and the inner electrode member electrically conductive through the contact portion. Likewise, the oxide coatings on the outer oxide electrode member and the chuck main body at a portion where the outer electrode member comes in contact with the chuck main body may be partially removed, thereby rendering the outer electrode member electrically conductive to the chuck main body.

The bipolar electrostatic chuck according to the present invention is formed of the chuck main body having the mounting surface, the annular electrode member that is fixed onto the mounting surface through the adhesive layer, the inner electrode member, and the outer electrode member. For that reason, the manufacture is easier than that of the conventional bipolar electrostatic chuck. Also, when the adhesive layer is made of a silicone-based adhesive agent or a polyvinyl butyral adhesive agent, the bipolar electrostatic chuck having the annular electrode member, the inner electrode member, and the outer electrode member fixed onto the mounting surface of the chuck main body through the adhesive agent according to the present invention can be readily separated into the chuck main body, the annular electrode member, the inner electrode member, and the outer electrode member by using a release agent after having been used in the semiconductor manufacturing device. In other words, the annular electrode member, the inner electrode member, and the outer electrode member which have been fixed onto the mounting surface of the chuck main body through the silicone-based adhesive agent can be readily removed from the mounting surface not depending on the heat treatment or the mechanical processing. For that reason, there is no drawback such as the deterioration of the mechanical material strength of the chuck main body due to heating, or a scratch caused by the mechanical processing. Then, the electrostatic chuck that has thus being separated can be again recycled as the electrostatic chuck.

The electrostatic chuck according to the present invention is used in a semiconductor manufacturing device in a state where the annular electrode member, the inner electrode member, and the outer electrode member are fixed onto the mounting surface of the chuck main body. For that reason, the oxide coating on the mounting surface of the chuck main body onto which the respective electrode members are fixed is hardly directly affected by the plasma exposure as compared with the respective electrode members that form the sample adsorption surface. For that reason, the chuck main body that has been separated as described above has only to be usually subjected to only a cleaning process such as cleaning using a dry ice blast or cleaning using an alcohol cleaning agent. As required because the outer peripheral surface of the chuck main body has a relatively large scratch, a process for reproducing the oxide coating on the surface of the chuck main body may be conducted. In the reproducing process, it is possible that the oxide coating that is attached onto the chuck main body is stripped, the chuck main body from which the oxide coating has been stripped is polished, and the oxide coating is reproduced by the anodic oxidation treatment as normally conducted.

On the other hand, it is better that the annular electrode member, the inner electrode member, and the outer electrode member are replaced by fresh ones. In the portions associated with the chuck main body, a cooling gas passage or a cooling structure using water cooling may be formed like a general bipolar electrostatic chuck. However, because the manufacture costs are increased due to those mechanical processing costs, it is effective from the viewpoints of the costs that the chuck main body is recycled. On the contrary, because the annular electrode member, the inner electrode member, and the outer electrode member are low in the manufacture costs as compared with the chuck main body, there arises particularly no problem on the costs even if those members are replaced with fresh ones. The annular electrode member, the inner electrode member, and the outer electrode member are advantageously replaced with fresh ones because the adsorption retaining function which is one of the important functions of the electrostatic chuck can be maintained to a higher performance since those electrode members form the sample adsorption surface that absorbs the sample in the bipolar electrostatic chuck.

The mounting surface of the chuck main body that has been subjected to necessary processing such as cleaning as described above is fixed with, for example, the fresh annular electrode, inner electrode member, and outer electrode member through the adhesive layer. In this process, the mounting surface of the chuck main body has an outer convex portion and an inner convex portion, and a positioning spacer is used between the chuck main body and the annular electrode member to position the respective electrode members in the heightwise direction. As a result, the electrostatic chuck can be reproduced in a state extremely close to the sample adsorption surface of the electrostatic chuck that has not yet been recycled. Likewise, when the positioning pin is disposed between the chuck main body and the respective electrode members, the positions of the respective electrode members in the horizontal direction with respect to the mounting surface can be also reproduced. Then, because the sample adsorption surface of the electrostatic chuck thus recycled is formed by the fresh annular electrode member, inner electrode member, and outer electrode member, the recycled electrostatic chuck has the same performance as that of the electrostatic chuck that has not yet been recycled in view of the adsorptive force, the temperature characteristic, and the performances of the electrostatic capacity and insulating resistance between those two electrodes. In addition, because the number of processing and assembling steps which are required for recycling can be reduced as much as possible, the above bipolar electrostatic chuck can be readily and inexpensively reproduced.

DESCRIPTION OF SYMBOLS

X . . . bipolar electrostatic chuck, W . . . semiconductor wafer, 1 . . . chuck main body, 1a . . . mounting surface, 1b . . . flange portion, 1c . . . base surface, 1d . . . outer ridge convex portion, 1e . . . inner ridge convex portion, 1f . . . fitting hole, 1g . . . corresponding fitting hole, 1h . . . conical groove, 1i . . . oxide coating, 2 . . . adhesive layer, 3 . . . toric electrode member, 3a . . . corresponding fitting hole, 3b . . . feeder pin hole, 4 . . . inner circular electrode member, 4a . . . corresponding fitting hole, 4h . . . projection portion, 4i . . . oxide coating, 5 . . . outer toric electrode member, 5a . . . fitting hole, 6 . . . volt, 7 . . . insulating spacers, 8 . . . sample adsorption surface, 9 . . . positioning conducting pin, 9a . . . stainless conducting spring, 10 . . . positioning pin, 11 . . . coolant gas passages, 12 . . . coolant gas passages, 13 . . . inner gas grooves, 14 . . . outer gas groove, 15 . . . gas room, 16 . . . insulating bush, 17 . . . feeder terminal.

BEST MODE FOR CARRYING OUT THE INVENTION

Hereinafter, preferred embodiments of the present invention will be described in detail with reference to the attached drawings.

FIRST EMBODIMENT (Bipolar Electrostatic Chuck)

Figure 1:
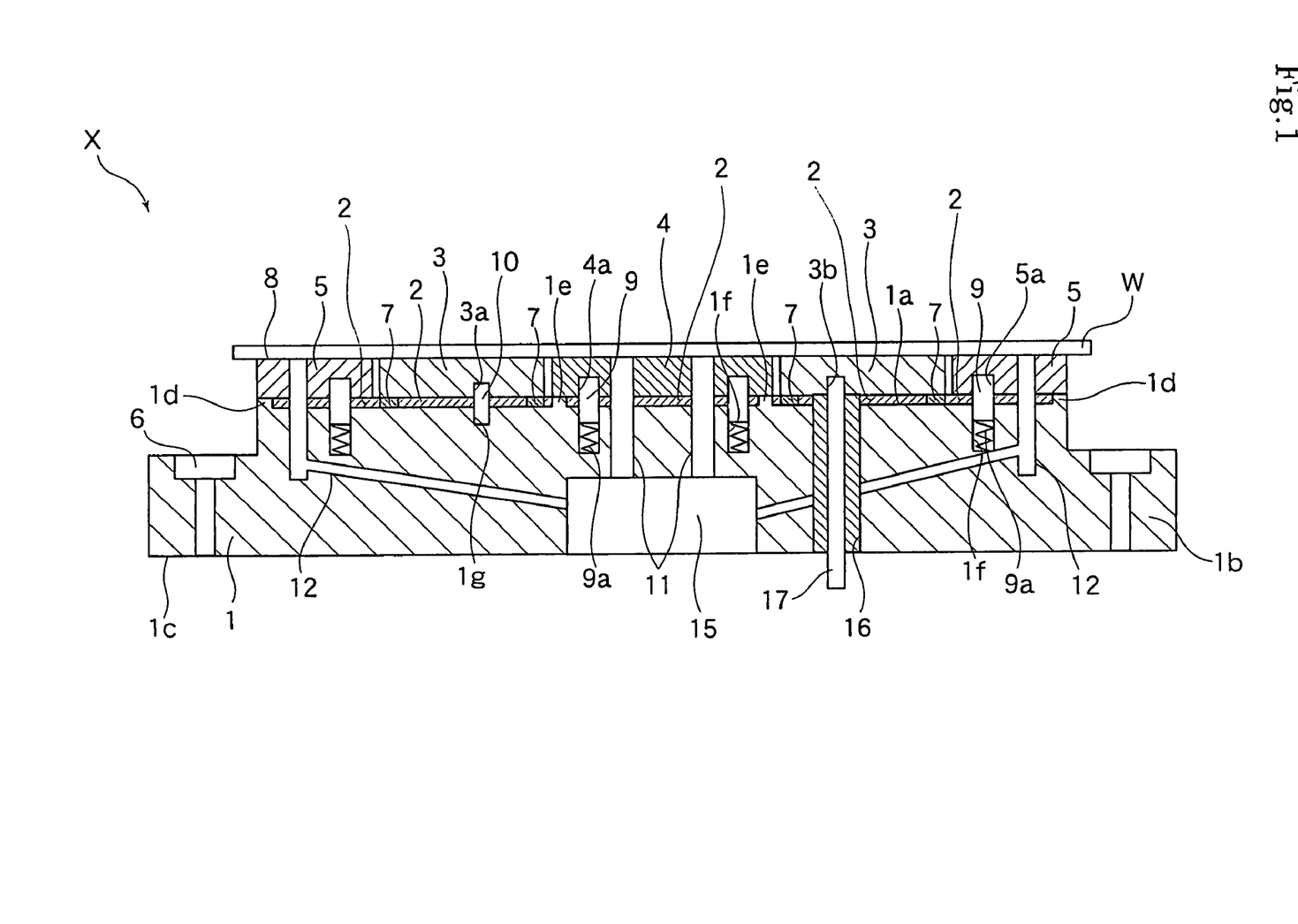
FIG. 1 is a cross-sectional view for explaining a bipolar electrostatic chuck X according to the first embodiment of the present invention.
Figure 2:
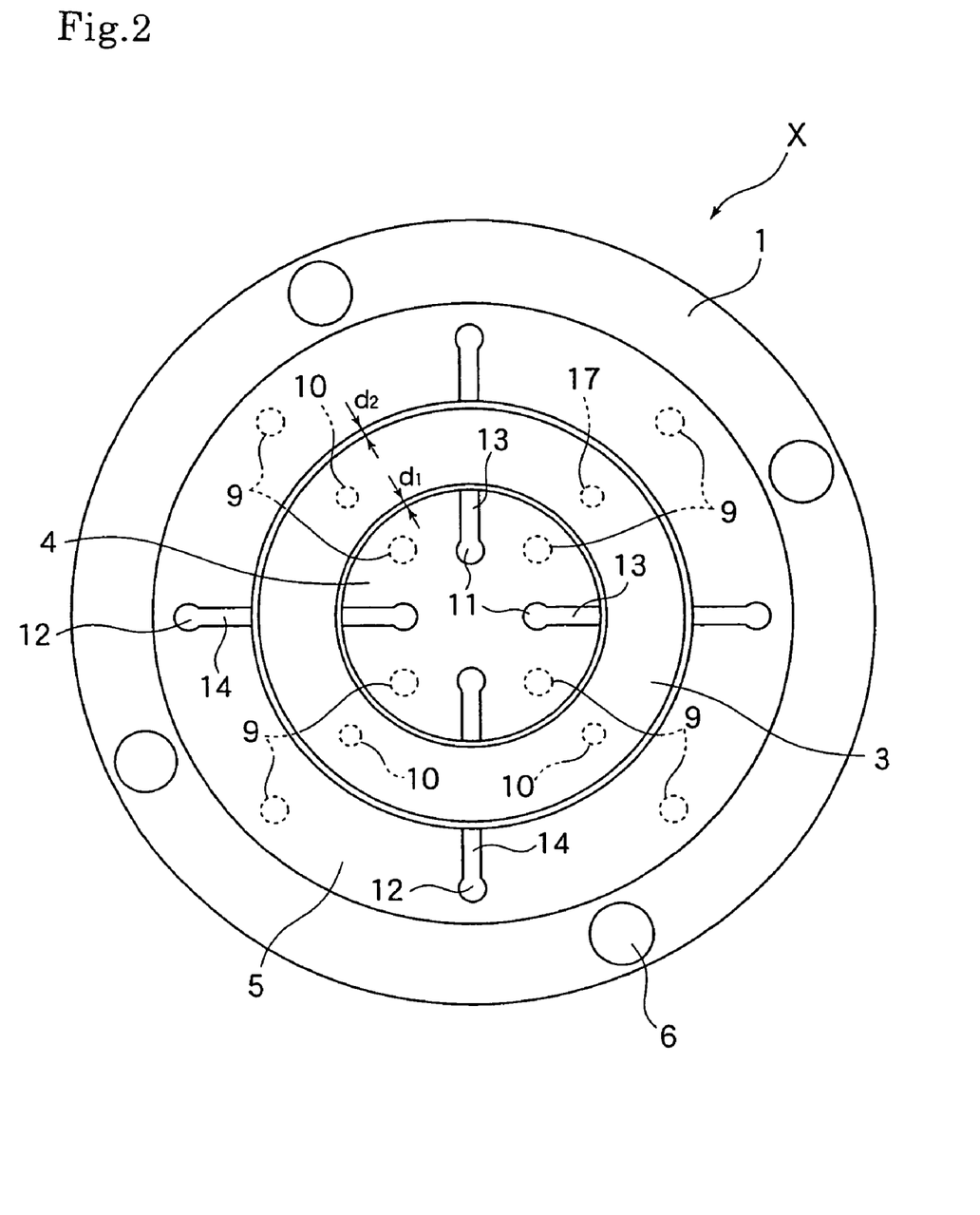
FIG. 2 is a plan view for explaining a bipolar electrostatic chuck X according to the first embodiment of the present invention.

FIG. 1 shows a cross-sectional view of a bipolar electrostatic chuck X according to the first embodiment of the present invention. FIG. 2 shows a plan view of the bipolar electrostatic chuck X according to the embodiment of the present invention.

The bipolar electrostatic chuck X is made into the shape of a circle by a structural extended material JIS A 6061 in the shape of a circle. The bipolar electrostatic chuck X is made up into the shape of a circle by a chuck main body 1 having a mounting surface 1a, and a toric electrode member 3 that is made of a pure aluminum member JIS A1100 which is fixed onto the mounting surface 1a of the chuck main body 1 through an adhesive layer 2 made of a gel silicone-based adhesive agent. The bipolar electrostatic chuck X is also made up of an inner circular electrode member 4 that is disposed with the center opening of the toric electrode member 3 which is made of a pure aluminum material JIS A1100 fixed onto the mounting surface 1a through the adhesive layer 2, and an outer toric electrode member 5 that is disposed outside of the toric electrode member 3 made of a pure aluminum material JIS A1100 is fixed onto the mounting surface 1a through the adhesive layer 2. The bipolar electrostatic chuck X is fixed onto a plasma etching device not shown through a base surface 1c of the chuck main body 1 with bolts by using a flange portion 1b disposed on an outer peripheral surface of the chuck main body 1. A surface of the toric electrode member 3, a surface of the inner circular electrode member 4, a surface of the outer toric electrode member 5, and a surface of the chuck main body 1 (except for the surface side of the base surface 1c) are formed with an oxide coating through an anodic oxidation treatment, respectively. Also, clearances $d_1$ and $d_2$ are given to defined between the toric electrode member 3 and the inner circular electrode member 4 and between the toric electrode member 3 and the outer toric electrode member 5, respectively. TSE3251 (viscosity 8.5 (25° C. Pa·s), thermal conductivity 0.18 (W/m·K)) made by GE Toshiba Silicone Corp. can be used as the above gel silicone-based adhesive agent.

A rim of the mounting surface 1a of the chuck main body 1 is provided with an outer ridge convex portion 1d in correspondence with an outer periphery of the outer toric electrode member 5. The outer toric electrode member 5 is positioned in a heightwise direction with respect to the mounting surface 1a by the outer ridge convex portion 1d. Also, the mounting surface 1a is provided with an inner ridge convex portion 1e at a position corresponding to the outer periphery of the inner circular electrode member 4. The inner circular electrode member 4 is positioned in a heightwise direction with respect to the mounting surface 1a by the inner ridge convex portion 1e. Further, eight insulating spacers 7 made of polyimide are interposed between the toric electrode member 3 and the chuck main body 1 in positions corresponding to the inner periphery and the outer periphery of the toric electrode member 3 at regular intervals of 45°, respectively. The toric electrode member 3 is positioned in a heigthwise direction with respect to the mounting surface 1a by the insulating spacers 7. Then, a sample adsorption surface 8 is formed from the toric electrode member 3, the inner circular electrode member 4, and the outer toric electrode member 5, and a semiconductor wafer W is mounted on the sample adsorption surface 8.

Also, positioning conducting pins 9 which are made of brass are disposed between the chuck main body 1 and the inner circular electrode member 4. Each of the positioning conducting pins 9 has one end fitted into a corresponding fitting hole 4a which is defined in a surface of the inner circular electrode member 4 opposite to the sample adsorption surface 8. The other end of the positioning conducting pin 9 has a stainless conducting spring 9a attached to a leading edge thereof, and is fitted into a fitting hole 1f that is defined in the chuck main body 1 so that the conducting spring 9a is urged against the conducting pin 9. Four positioning conducting pins 9 are disposed at an inner side of the inner ridge convex portion 1e in the mounting surface 1a so as to be lined up in regular intervals of 90° on the circumference of the inner circular electrode member 4. Likewise, positioning conducting pins 9 that are fitted into fitting holes 5a defined in the outer toric electrode member 5 are disposed between the chuck main body 1 and the outer toric electrode member 5 in the same way as the inner circular electrode member 4. Those positioning conducting pins 9 position the inner circular electrode member 4 and the outer toric electrode member 5 in the horizontal direction in respect to the mounting surface 1a of the chuck main body 1, and also constitute the first electrode consisting of the chuck main body 1, the inner circular electrode member 4, and the outer toric electrode member 5.

Also, positioning pins 10 made of polyimide are disposed between the chuck main body 1 and the toric electrode member 3. Each of the positioning pins 10 has one end fitted into a corresponding fitting hole 3a which is defined on the surface of the toric electrode member 3 opposite to the sample adsorption surface 8, and the other end fitted into a corresponding fitting hole 1g which is defined in the chuck main body 1. The three positioning pins 10 are arranged substantially in the center position of the inner periphery and the outer periphery of the toric electrode member 3 in the mounting surface 1a so as to be lined up in regular intervals of 90° on a semicircle. The positioning pins 10 position the toric electrode member 3 in the horizontal direction with respect to the mounting surface 1a of the chuck main body 1.

The electrostatic chuck X is formed with coolant gas passages 11 that communicate with the chuck main body 1 and the inner cylindrical electrode member 4, and coolant gas passages 12 that communicate with the chuck main body 1 and the outer toric electrode member 5, respectively. In this example, the coolant gas passages 11 that communicate with the chuck main body 1 and the inner circular electrode member 4 also serve as through holes which thrust pins of the semiconductor wafer W mounted on the sample adsorption surface 8 penetrate. Inner gas grooves 13 that communicate with the corresponding coolant gas passages 11 are formed toward the outer peripheral direction of the upper surface of the inner circular electrode member 4 which forms the sample adsorption surface 8. Similarly, outer gas grooves 14 that communicate with the corresponding coolant gas passages 12 are formed on an upper surface of the outer toric electrode member 5 which forms the sample adsorption surface 8. The coolant gas passages 11 and 12 communicate with a gas chamber, respectively. The coolant gas that has been transmitted from the coolant gas passages 11 partially flows into the gap $d_1$ defined between the inner circular electrode member 4 and the toric electrode member 3 on the upper surface of the inner circular electrode member 4, and the coolant gas that has been transmitted from the coolant gas passages 12 partially flows into the gap $d_2$ defined between the outer toric electrode member 5 and the toric electrode member 3 on the upper surface of the outer toric electrode member 5. For that reason, the dispersion of the coolant gas on the sample adsorption surface 8 is uniformed.

In addition, a through hole that penetrates between the mounting surface 1a and the base surface 1c is defined in the chuck main body 1, and an insulating bush 16 is fitted into the through hole in such a manner that one end of the insulating bush 16 reaches the lower surface (a surface opposite to the sample adsorption surface 8) of the toric electrode member 3. Also, a feeder pin hole 3b is formed at a position substantially in the center of the insulating bush 16 in the lower surface of the toric electrode member 3. A feeder terminal 17 that is fitted into the feeder pin hole 3b through the interior of the insulating bush 16 is attached to the base surface 1c side of the chuck main body, with the result that the toric electrode member 3 constitutes a second electrode. The feeder terminal 17 is arranged at regular intervals of 90° concentrically with the positioning pins 10 disposed between the chuck main body 1 and the toric electrode member 3.

In this example, an electrostatic chuck mounting seating surface of the plasma etching device of an electrically conductive member not shown is formed and is connected with any positive or negative electrode of a dc power supply not shown. Because the base surface 1c of the chuck main body 1 is not formed with an oxide coating, the base surface 1c is fixed in contact with the electrostatic chuck mounting seating surface of the plasma etching device side, to render the chuck main body 1 and the electrostatic chuck mounting seating surface of the plasma etching device side electrically conductive to each other. That is, one electrode of the dc power supply is connected to the chuck main body 1. Also, the feeder terminal 17 that is mounted on the toric electrode member 3 is connected with an electrode opposite in polarity to the electrode of the dc power supply which is connected to the chuck main body 1. In this way, a positive or a negative voltage is shared and applied to the first electrode and the second electrode, to thereby constitute the bipolar electrostatic chuck X.

(Disassembly of the Bipolar Electrostatic Chuck)

After the bipolar electrostatic chuck X according to the above first embodiment is used in the plasma etching device, the bipolar electrostatic chuck X is removed from the plasma etching device and immersed in a xylene bath. The electrostatic chuck X that has been taken out of the xylene bath after having been immersed in the xylene bath for eight hours while the temperature of the xylene bath is held at 15° C., from this the silicone-based adhesive agent used as the adhesive layer 2 is swelled and the adhesive force is weakened. The respective electrode members of the toric electrode member 3, the inner circular electrode member 4, and the outer toric electrode member 5 can be readily removed from the mounting surface 1a of the chuck main body 1.

(Recycle of the Bipolar Electrostatic Chuck)

Subsequently, in the electrostatic chuck X that has been disassembled as described above, the respective electrode member of the toric electrode member 3, the inner circular electrode member 4, and the outer toric electrode member, and the conducting spring 9a which is attached to one end of the positioning conducting pin 9 are discarded without being recycled. The chuck main body 1, the positioning conducting pin 9, the positioning pin 10, and the insulating spacer 7 are subjected to dry ice blast exposure under the conditions of a discharge pressure of 20 Pa with an exposure time of 5 minutes, to thereby remove extraneous matter from the surface. Then, the chuck main body 1, the positioning conducting pin 9, the positioning pin 10, and the insulating spacer 7 are immersed in an acetone bath and then ultrasonically cleaned under the conditions of an ultrasonic addition of 150 W for 10 minutes. Thereafter, those members are cleaned in a pure water bath under the conditions of an ultrasonic addition 150 W for 5 minutes. After the ultrasonic cleaning has been conducted, the electrode members and so on are dried by hot air, respectively.

In recycle, the respective electrode members of the toric electrode member 3, the inner circular electrode member 4, and the outer toric electrode member 5 are newly fabricated. In this situation, the respective electrode members are made of the same material as those before replacement, and the oxide coatings formed on those electrode members have the same thickness. Also, the fitting holes 3a, 4a, and 5a that are defined in the respective electrode members are formed in the same configuration at the same positions as those before replacement. In addition, the coolant gas passages 11 and the inner gas grooves 13 are formed in the inner circular electrode member 4, and the coolant gas passages 12 and the outer gas grooves 14 are formed in the outer toric electrode member 5. Further, the conducting springs 9a that are newly prepared are fitted to one ends of the positioning conducting pins 9 after cleaning.

The bipolar electrostatic chuck X according to the first embodiment is assembled with the use of the chuck main body 1, the positioning conducting pins 9, the positioning pins 10, and the insulating spacer 7 which have been cleaned respectively, and the toric electrode member 3, the inner circular electrode member 4, the outer toric electrode member 5, and the conducting springs 9a newly replaced, in the same manner as that described above, thereby making it possible to obtain the bipolar electrostatic chuck X by recycle.

SECOND EMBODIMENT (Bipolar Electrostatic Chuck)

Figure 3:
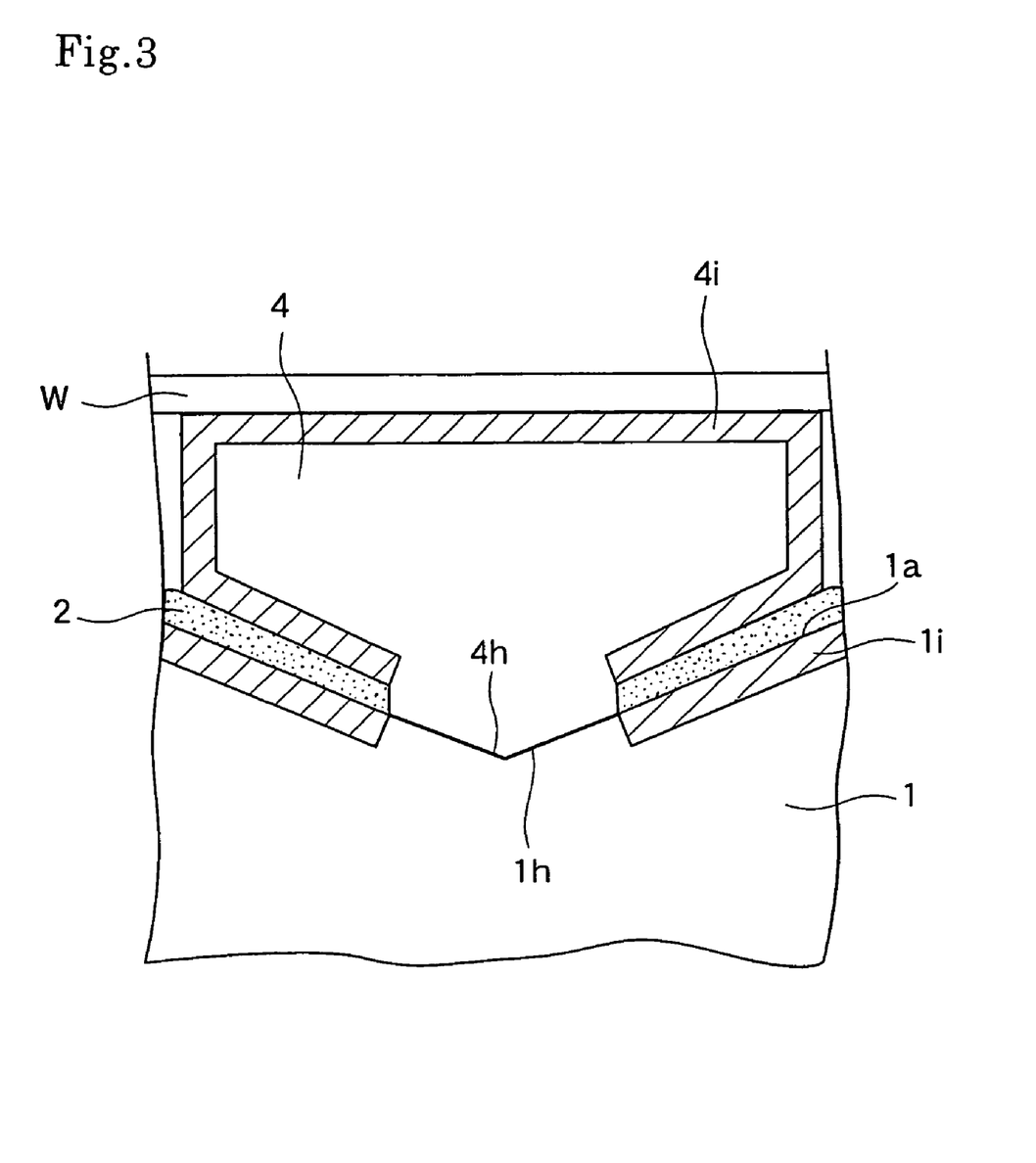
FIG. 3 is a partial cross-sectional view for explaining a bipolar electrostatic chuck X according to the second embodiment of the present invention.

FIG. 3 shows a modified example showing a relationship between the inner circular electrode member 4 and the mounting surface 1a to which the inner circular electrode member 4 is fixed in the bipolar electrostatic chuck X according to the first embodiment of the present invention.

The inner circular electrode member 4 has a bottom surface side (an opposite side of the sample adsorption surface 8) conically shaped, and also has a projection portion 4h conically formed at the bottom surface side. An oxide coating 4i is formed on the surface of the inner circular electrode member 4 except for the surface portion of the projection portion 4h in the same manner as that in the first embodiment. Also, the mounting surface 1a of the chuck main body 1 onto which the inner circular electrode member 4 is fixed through the adhesive layer 2 is formed with a conical groove 1h corresponding to the configuration of the bottom surface side of the inner circular electrode member 4. For that reason, the conical groove 1h and the projection portion 4h of the inner circular electrode member 4 are fixed in a complementary configuration. In addition, an oxide coating 1i is formed on the surface of the mounting surface 1a of the chuck main body 1 except for a portion of the conical groove 1h which comes in contact with the projection portion 4h of the inner circular electrode member 4 in the same manner as that in the first embodiment.

In the bipolar electrostatic chuck X according to the second embodiment shown in FIG. 3, the projection portion 4h of the inner circular electrode member 4 which is fixed to the mounting surface 1a, and the conical groove 1h in the mounting surface 1a which is complementarily configured with the projection portion 4h have no oxide coating. As a result, the inner circular electrode member 4 that is fixed onto the mounting surface 1a of the chuck main body 1 and the chuck main body 1 can be rendered electrically conductive through the contact surface of the projection portion 4h. For that reason, there is no need to provide the positioning conducting pin 9 like the electrostatic chuck X according to the first embodiment. Also, because the projection portion 4h of the inner circular electrode member 4 is fixed with the conical groove 1h formed in the mounting surface 1a in the complementary configuration, the inner circular electrode member 4 is positioned in the horizontal direction with respect to the mounting surface 1a. In addition, because the inner circular electrode member 4 is fixed onto the mounting surface 1a in such a manner that the projection portion 4h is fixed in direct contact with the mounting surface 1a, the inner circular electrode member 4 is positioned in the heightwise direction with respect to the mounting surface 1a without provision of the inner ridge convex portion 1e at a position corresponding to the inner circular electrode member 4 as with the mounting surface 1a of the chuck main body 1 in the electrostatic chuck X of the first embodiment. The relationship between the inner circular electrode member 4 and the mounting surface 1a of the chuck main body 1 in the second embodiment may be identical with that in the first embodiment except for the above structure.

The disassembly of the bipolar electrostatic chuck X and the recycle of the bipolar electrostatic chuck X according to the second embodiment can be conducted in the same procedure as that in the first embodiment.

THIRD EMBODIMENT (Bipolar Electrostatic Chuck)

A bipolar electrostatic chuck according to a third embodiment is identical with that in the first embodiment except that as the silicone-based adhesive agent that makes up the adhesive layer 2 of the bipolar electrostatic chuck X according to the first embodiment, an elastomer-based adhesive agent containing a heat transmission filler is used. The silicone-based adhesive agent of the elastomer type may be used SE 4400 made by Dow Corning Toray Silicon Co., Ltd (viscosity before hardening 76 (25° C. Pa·s), thermal conductivity 0.92 (W/m·K)).

The disassembly and recycle of the bipolar electrostatic chuck X according to the third embodiment can be conducted in the same procedure as that in the first embodiment.

INDUSTRIAL APPLICABILITY OF THE INVENTION

The bipolar electrostatic chuck of the present invention can be easily manufactured as compared with the conventional bipolar electrostatic chuck. After use, the electrostatic chuck can be readily separated, and the reproduction costs can be reduced by efficiently recycling the electrostatic chuck. Also, the assembly for recycle is easy, and the performance of the electrostatic chuck obtained by recycle can be maintained to the same level as that before recycle.

The invention claimed is:

1. A bipolar electrostatic chuck, comprising:
a chuck main body having a mounting surface;
an annular electrode member which is formed in an annular configuration with a center opening and is fixed onto the mounting surface;
an inner electrode member which is disposed at a given clearance from the annular electrode member within the center opening of the annular electrode member and is fixed onto the mounting surface; and
an outer electrode member which is disposed at a given clearance from the annular electrode member outside of the annular electrode member and is fixed onto the mounting surface
wherein, at the time of assembling, the annular electrode member, the inner electrode member, and the outer electrode member are fixed onto the mounting surface through an adhesive layer, the inner electrode member and the outer electrode member constitute a first electrode, and the annular electrode member constitutes a second electrode, and after use, the annular electrode member, the inner electrode member, and the outer electrode member can be separated from the mounting surface by removing the adhesive layer, and
wherein the adhesive layer is made of the silicone-based adhesive agent, and after use, the annular electrode member, the inner electrode member, and the outer electrode member can be separated from the mounting surface by removing the adhesive layer using a release agent.

2. The bipolar electrostatic chuck according to claim 1, wherein the silicone-based adhesive agent is a gel adhesive agent or an elastomer-based adhesive agent.

3. A bipolar electrostatic chuck, comprising:
a chuck main body having a mounting surface;
an annular electrode member which is formed in an annular configuration with a center opening and is fixed onto the mounting surface;
an inner electrode member which is disposed at a given clearance from the annular electrode member within the center opening of the annular electrode member and is fixed onto the mounting surface; and
an outer electrode member which is disposed at a given clearance from the annular electrode member outside of the annular electrode member and is fixed onto the mounting surface
wherein, at the time of assembling, the annular electrode member, the inner electrode member, and the outer electrode member are fixed onto the mounting surface through an adhesive layer, the inner electrode member and the outer electrode member constitute a first electrode, and the annular electrode member constitutes a second electrode, and after use, the annular electrode member, the inner electrode member, and the outer electrode member can be separated from the mounting surface by removing the adhesive layer, and
wherein the adhesive layer is made of the polyvinyl butyral adhesive agent, and after use, the annular electrode member, the inner electrode member, and the outer electrode member can be separated from the mounting surface by removing the adhesive layer heating at a temperature of about 150° C.

4. The bipolar electrostatic chuck according to claim 1 or 3, wherein the chuck main body constitutes the first electrode together with the inner electrode member and the outer electrode member.

5. The bipolar electrostatic chuck according to claim 1 or 3, wherein the mounting surface of the chuck main body has an outer convex portion for positioning the outer electrode member in a heightwise direction with respect to the mounting surface and/or an inner convex portion for positioning the inner electrode member in the heightwise direction with respect to the mounting surface.

6. The bipolar electrostatic chuck according to claim 1 or 3, wherein positioning pins that position the inner electrode member, the annular electrode member, and the outer electrode member in a horizontal direction with respect to the mounting surface are disposed between the chuck main body, and the inner electrode member, the annular electrode member, and the outer electrode member which are fixed onto the mounting surface of the chuck main body through the adhesive layer, respectively.

7. The bipolar electrostatic chuck according to claim 1 or 3, wherein at least one of the inner electrode member, the annular electrode member, and the outer electrode member which are fixed onto the mounting surface of the chuck main body through the adhesive layer is fixed onto the mounting surface of the chuck main body in a complementary configuration with each other.

8. The bipolar electrostatic chuck according to claim 1 or 3, wherein the chuck main body and the annular electrode member have interposed therebetween a positioning spacer for positioning the annular electrode member in the heigthwise direction with respect to the mounting surface.

9. The bipolar electrostatic chuck according to claim 1 or 3, wherein the inner electrode member, the annular electrode member, and the outer electrode member are made of pure aluminum.

* * * * *